United States Patent [19]
Katoh et al.

[11] Patent Number: 5,561,630
[45] Date of Patent: Oct. 1, 1996

[54] DATA SENSE CIRCUIT FOR DYNAMIC RANDOM ACCESS MEMORIES

[75] Inventors: Daisuke Katoh, Poughkeepsie; Toshiaki Kirihata, Wappingers Falls; Munehiro Yoshida, Fishkill, all of N.Y.

[73] Assignees: International Business Machines Coporation, Armonk, N.Y.; Kabushiki Kaisha Toshiba, Kawasaki, Japan

[21] Appl. No.: 535,704

[22] Filed: Sep. 28, 1995

[51] Int. Cl.$^6$ .............................. G11C 7/00; G11C 29/00
[52] U.S. Cl. ................... 365/189.01; 365/189.02; 365/201; 365/203; 371/21.3
[58] Field of Search ................ 365/189.01, 189.02, 365/201, 202, 203, 210; 371/21.3

[56] References Cited

U.S. PATENT DOCUMENTS

| | | | |
|---|---|---|---|
| 4,636,987 | 6/1987 | Norwood et al. | 365/208 |
| 4,825,418 | 4/1989 | Itoh et al. | 365/207 |
| 4,839,868 | 6/1989 | Sato et al. | 365/230.06 |
| 4,947,377 | 8/1990 | Hannai | 365/208 |
| 5,014,245 | 5/1991 | Muroka et al. | 365/194 |
| 5,243,574 | 9/1993 | Ikeda | 365/207 |
| 5,267,214 | 11/1993 | Fujishima et al. | 365/230.03 |
| 5,305,266 | 4/1994 | Roundtree | 365/201 |
| 5,315,555 | 5/1994 | Choi | 365/207 |
| 5,515,326 | 5/1996 | Hirose et al. | 365/189.01 |

FOREIGN PATENT DOCUMENTS 63-74199  4/1988  Japan .
3-241589  10/1991  Japan .

OTHER PUBLICATIONS

S. Dhong, et al, "Fully–Divided Bit Line for Dynamic Random–Access Memory Sensing Circuitry" IBM Technical Disclosure Bulletin, V. 31, No. 7, pp. 266–272, Dec. 1988.

*Primary Examiner*—David C. Nelms
*Assistant Examiner*—Trong Phan
*Attorney, Agent, or Firm*—Charles W. Peterson, Jr.

[57] ABSTRACT

An improved data sense for a DRAM. Each bit line pair is coupled through a pair of high-resistance pass gates to a sense amp. During sense, the high-resistance pass gates act in conjunction with the charge stored on the bit line pair as, effectively, a high-resistance passive load for the sense amp. A control circuit selectively switches on and off bit line equalization coincident with selectively passing either the equalization voltage or set voltages to the sense amp and an active sense amp load. Further, after it is set, the sense amp is selectively connected to LDLs through low-resistance column select pass gates. Therefore, the sense amp quickly discharges one of the connected LDL pair while the bit line voltage remains essentially unchanged. Thus, data is passed from the sense amp to a second sense amplifier and off chip. After data is passed to the LDLs, the control circuit enables the active sense amp load to pull the sense amp high side to a full up level.

19 Claims, 5 Drawing Sheets

DATA SENSE CIRCUIT FOR DYNAMIC RANDOM ACCESS MEMORIES

RELATED APPLICATION

This application is related to application Ser. No. 08/535,702 filed on Sep. 28, 1995 to Debrosse, et al., entitled "A Random Access Memory with a Simple Test Arrangement", and to application Ser. No. 08/535,446, filed on Sep. 28, 1995 to Debrosse, et al., entitled "DRAM Signal Margin Test Method", both applications assigned to the Assignee of the present Application, and both applications filed coincident herewith and incorporated herein by reference.

FIELD OF THE INVENTION

The present invention relates generally to high performance semiconductor memories and more particularly to sensing data stored in high performance semiconductor memories.

BACKGROUND OF THE INVENTION

Computer system performance depends upon processor performance and memory performance. Various ways (e.g., pipelining) are known to improve processor performance. Usually processors are faster than the Dynamic Random Access Memory (DRAM) they are using. So, high performance DRAM is always at a premium. Consequently, a primary concern of memory chip designers is performance. High performance memory designers are always seeking new approaches to reduce memory access time.

One approach, known as caching, is to place fast Static Random Access Memory (SRAM) between the processor and the DRAM. Blocks of data are transferred from the DRAM to the faster SRAM cache. This SRAM cache can match or nearly match processor speed, at a price of complicating the system and increasing system cost.

Still other approaches include the Burst Enhanced Data Out (Burst EDO) RAM and Synchronous DRAM (SDRAM). These approaches essentially merge a small cache onto the DRAM.

While these approaches nearly match RAM performance to processor performance for sequential data transfers, out-of-order data transfers are not matched. Out-of-order data transfers are slower because they may initiate an access to data in a block of memory other than the current block in the cache. In such circumstances, there is a long delay between the processor requesting data and the DRAM providing the requested data to the processor. This delay is known as latency. Provided the processor restricts its memory accesses to sequential addresses, system performance is not impaired. However, this is not practical. So, as the percentage of out-of-order memory operations (such as branches) increase, system performance decreases. Therefore, to some extent system performance is gated by the memory's latency time. Thus, reducing DRAM latency, the time between initiating an access in a new block and receiving the first data bit from the block, is important for improving system performance and is, therefore, an important objective in DRAM design.

FIG. 1 is a schematic representation of a prior art wide Input/Output (I/O) 16Mb DRAM chip. The chip 100 is organized with two Redundant Bit Lines (RBL) 102 and 104 providing two spare columns in each subarray 106. Each subarray 106 includes $2^n$ Bit Line (BL) pairs 108 (where n is typically between 5 and 8) and one or more redundant bit line pairs (2 in this example). As used hereinafter, reference to a bit line refers to a complementary pair of lines. Each of the subarrays 106 is part of a subarray block 110. All of the subarray blocks 110, collectively, form the entire RAM array. So, for example, a 16Mb RAM has 16 blocks 110 of 1Mb each. Block size, subarray size and the number of subarrays 106 per block 110 are interdependent and, selected based on performance and design objectives.

Multiple bits of a subarray block 110 are accessed (read from or written to) when one word line 112 is selected and driven high. Data from accessed cells are provided simultaneously to the bit lines 108 and redundant bit lines 102 and 104. After a predetermined minimum delay, a single bit line 108 is selected in each subarray 106. The selected bit line 108 is coupled to a Local Data Line (LDL) 114. LDLs 114 are coupled to Master Data Lines (MDLs) 116. The MDLs 116 couple corresponding subarrays 106 in each subarray block 110. Data is transferred between the subarrays 106 and the chip I/O's on the MDLs 116.

FIG. 2A is a transistor level cross-sectional schematic of a bit line 108 in a subarray 106. Cells 120, 122 connected to adjacent word lines 112,118 also are connected to opposite lines 124, 126 of each bit line pair. Thus, half of the word lines 112 (e.g., word lines with even addresses) select cells 120 on one line 124 of the bit line pair. While the remaining half of the word lines 118, (odd addressed word lines) select the cells 122 on the other lines 126 of the bit line pair. Each cell's storage capacitor ($C_s$) 128 is, typically, a trench capacitor or a stacked structure for array density. Each bit line 124,126 has essentially the same capacitance ($C_{BL}$). The voltage stored on $C_s$ is referred to herein as $V_s$ and the voltage on the $C_{BL}$ is referred to as $V_{BL}$.

The circuit of FIG. 2A operates according to the timing diagram of FIG. 2B. A "one" is stored in any cell 120, 122 by charging the cell's storage capacitor 128, 138 to $V_{dd}$. Prior to selecting a cell 120 or 122, the array is pre-charged to its steady-state standby condition. The voltage on the bit line pair 124, 126 is pulled to $V_{dd}/2$ and equalized by equalization transistor 134 because equalization signal (EQ) on its gate 132 is high. The Word Lines (WL) 112, 118 and Column SeLect (CSL) lines 136 are held low during standby. Additionally, each word line may be clamped low (unless driven high) by a simple resetable latch (not shown).

When the chip's Row Address Strobe signal (RAS) is asserted indicating the array is to be accessed. EQ is pulled low, isolating the bit line pair from each other and from the $V_{dd}/2$ pre-charge supply, floating each line of the bit line pair at $V_{dd}/2$. A selected word line 112 (or 118) is driven high. The cell's access gate 130 is turned on in each cell 120 on the selected word line 112, coupling the accessed cell's storage capacitor 128 to line 124 of the bit line pair. Thus, a data signal $V_{SIG}$ develops when charge is transferred between the storage capacitor 128 and line 124. It can be shown that $V_{SIG} = \pm V_{dd}/2 * C_s/(C_s+C_{BL})$. The other line 126 of the bit line pair 124,126 remains at its pre-charge voltage level $V_{dd}/2$ and serves as a reference voltage for the sense amplifier 140.

Typically, bit line capacitance $C_{BL}$ is at least one order of magnitude larger than the storage capacitor 128. So, even though $V_s$ is $V_{dd}$ or 0V, $V_{SIG}$ is normally at least an order of magnitude smaller than $V_{dd}$.

After a built-in timing delay sufficient to allow $V_{SIG}$ to develop, i.e. to transfer $V_s$ to the bit line, the Sense Amp Enable (SAE) line 142 goes high and, subsequently, pulls its inverse ($\overline{SAE}$) 144 low to set the sense amp 140. The sense amp 140 amplifies $V_{SIG}$ and re-driven on the bit line pair 124, 126 forcing them High/Low or Low/High depending on data stored in the cell 120. Simultaneously with re-driving the bit line pair, the sense amp writes the sensed data back into the selected cell 120. Once the sense is complete, a Column SeLect signal (CSL) rises to activate the column decoder for column i. So, driving CSL 146 high selects column i in each accessed subarray 106 by connecting the selected column i bit line pair 124, 126 to the LDLs 148, 150 through pass gates 152, 154.

Any time removed from this data path improves RAM latency which shortens block access time.

PURPOSES OF THE INVENTION

It, therefore, is a purpose of the present invention to improve computer system performance.

It is another purpose of the present invention to reduce RAM block access time.

It is yet another purpose of the present invention to reduce RAM latency.

SUMMARY OF THE INVENTION

In the preferred embodiment of the present invention, a bit line pair is coupled through a pair of high-resistance pass gates to a sense amp. During sense, the high-resistance pass gates act in conjunction with the charge stored on the bit line pair as, effectively, a high-resistance passive load for the sense amp. If multiple bit line pairs are connected to the same sense amp, the high resistance pass gates each form a branch of a mux connecting the bit line pairs to the sense amp. A control circuit selectively switches on and off bit line equalization coincident with selectively passing either the equalization voltage or set voltages to the sense amp and an active sense amp load. Further, after it is set, the sense amp is selectively connected to LDLs through low-resistance column select pass gates. Therefore, the sense amp quickly discharges one of the connected LDL pair while the bit line voltage remains essentially unchanged. Thus, data is passed from the sense amp to a second sense amplifier and off chip. After data is passed to the LDLs, the control circuit enables the active sense amp load to pull the sense amp high side to a full up level. Finally the resistance of the high resistance pass gates is reduced to drive the sensed data back onto the bit line pair.

In one preferred embodiment, the Dynamic Random Access Memory (DRAM) includes an array of memory cells organized in rows and columns; a word line in each row connected to memory cells in the row and responsive to a row address; a plurality of bit line pairs in each column, the column is selected responsive to a column address. Each bit line pair includes restoring means for restoring the bit line pair to a reference voltage level, equalization means for selectively shorting both lines of the half bit line pair together, and, a partial mux. The partial mux is a pair of NFETs. Each bit line of the pair is connected to one NFET of the pair. A sense amp is connected between a sense enable and the mux. The mux is formed by the column's plurality of bit line pair's partial muxes. The read select resistance of the NFETs in the partial muxes is such that a data signal on a selected bit line pair is passed to the sense amp, while setting the sense amp leaves signal on the bit line pair substantially unaffected. A pair of cross coupled PFETs are connected between the sense amp and a sense latch enable. A pair of column select pass gates connect the sense amp to a LDL. The column select pass gates' select resistance is such that when said sense amp is set, data in the sense amp is passed to the LDL, while the signal on the bit line pair remains substantially unaffected. The partial mux NFETs have a higher read select resistance than the column select pass gates.

DESCRIPTION OF THE PREFERRED EMBODIMENTS

In the preferred embodiment of the present invention, a bit line pair is coupled through a pair of high-resistance pass gates to a sense amp. During sense, the high-resistance pass gates act in conjunction with the charge stored on the bit line pair as, effectively, a high-resistance passive load for the sense amp. A control circuit selectively switches on and off bit line equalization coincident with selectively passing either the equalization voltage or set voltages to enable the sense amp. Further, after it is set, the sense amp is selectively connected to LDLs, which are pre-charged to $V_{dd}'$ through low-resistance column select pass gates. The column select pass gates, which are NFETs, allow passing data to the LDLs prior to setting the active sense amp load, even though the LDLs are pre-charged to $V_{dd}$. The NFET threshold prevents the $V_{dd}$ pre-charge from destroying the sensed data. Therefore, the sense amp quickly discharges one of the connected LDL pair while the bit line voltage remains essentially unchanged. Thus, data is passed from the sense amp to a second sense amplifier and off chip. After data is passed to the LDLs, the control circuit enables the active sense amp load to pull the sense amp high side to a full up level. Finally, the gate voltage on the high resistance pass gates is boosted to reduce their select resistance in order to quickly write the sensed data back into the array, thereby refreshing the cell.

Figure 1:
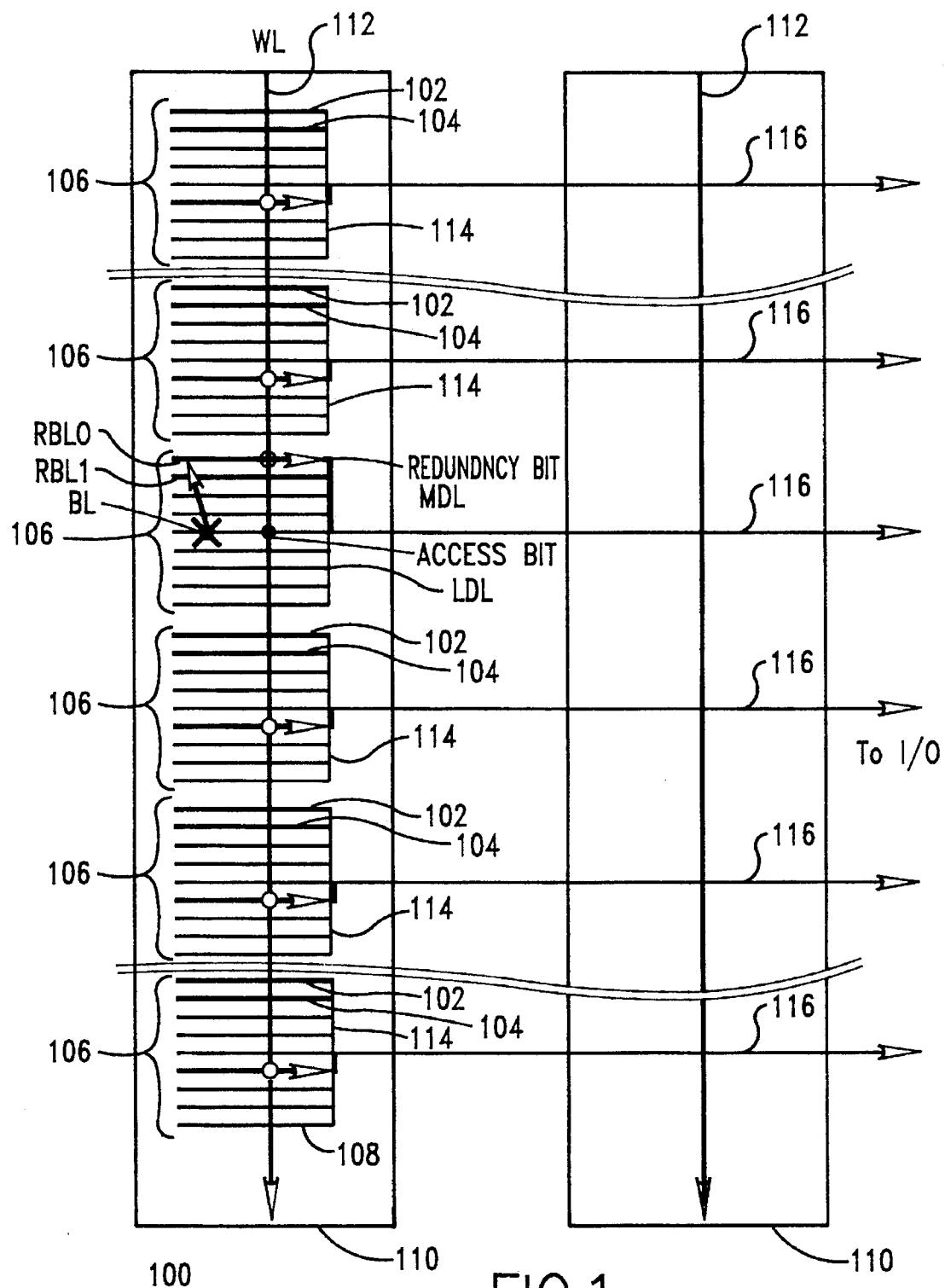
FIG. 1 is a schematic representation of a prior art wide I/O RAM.
Figure 2A:
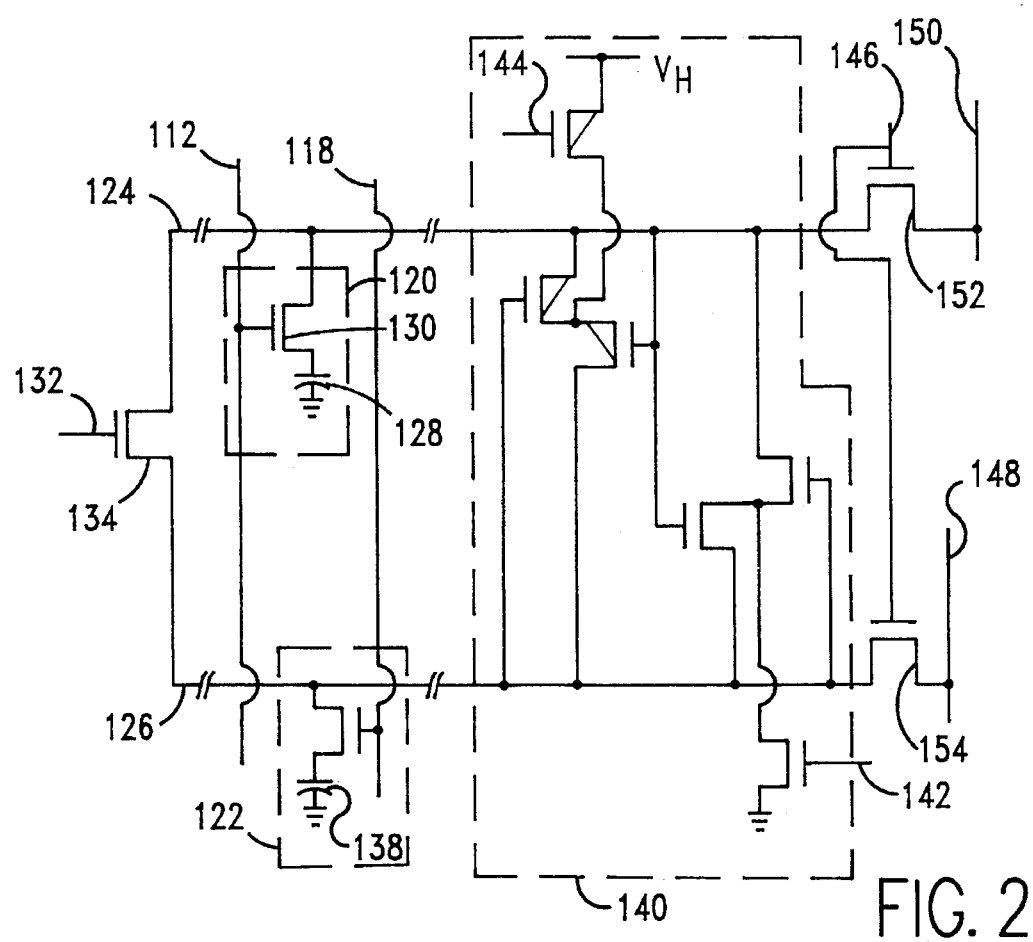
FIG. 2A is a transistor level cross-sectional schematic of a prior art segment.
Figure 2B:
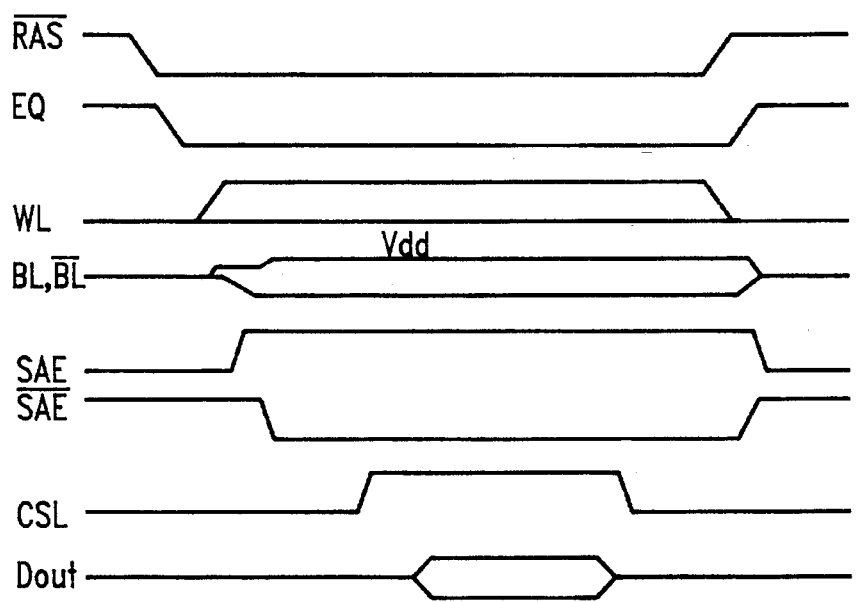
FIG. 2B is a timing diagram for the cross section of FIG. 2A.
Figure 3A:
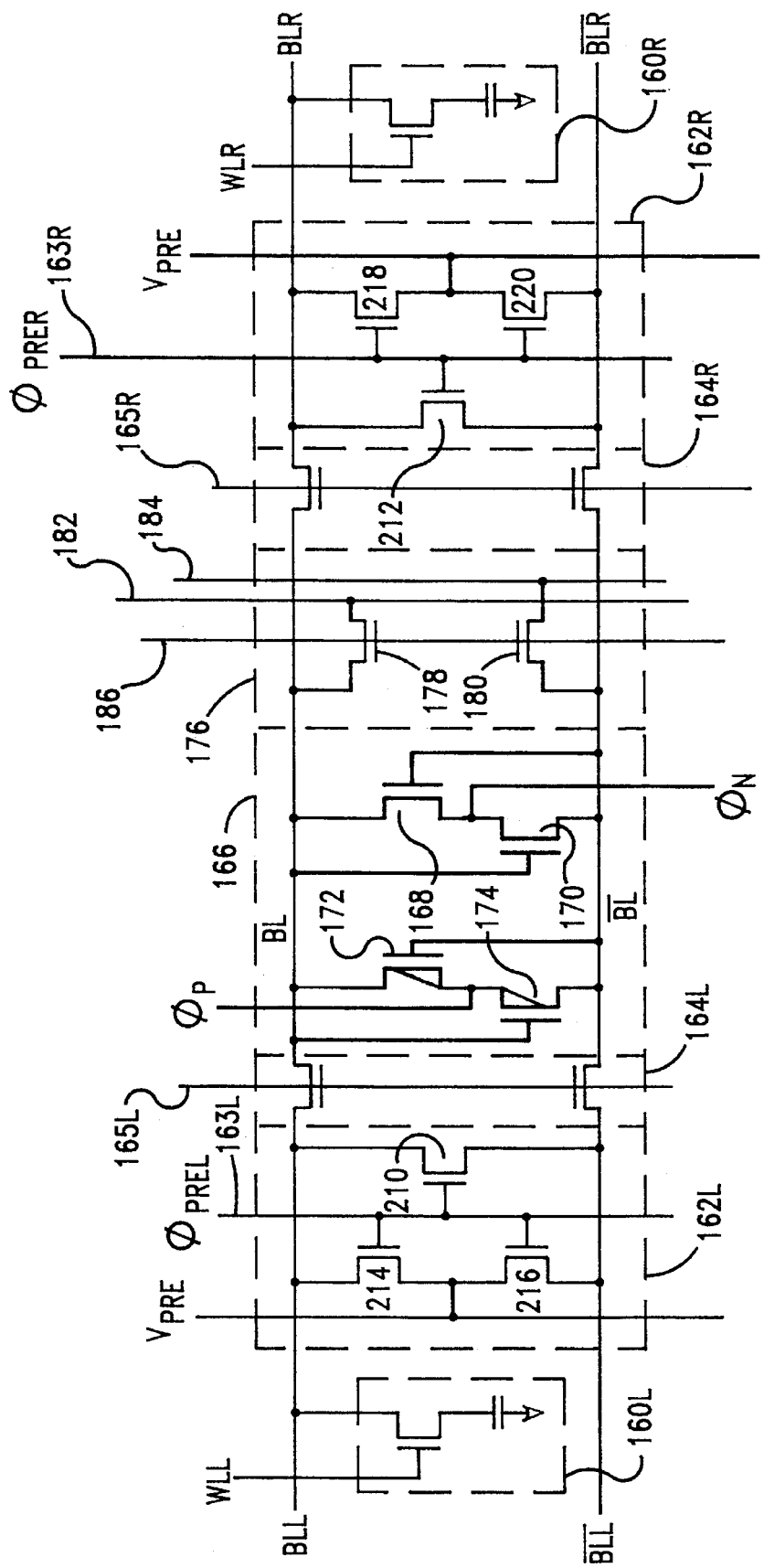
FIGS. 3A–C schematically represents an array cross section, a sense circuit and control logic according to the preferred embodiment of the present invention.
Figure 3B:
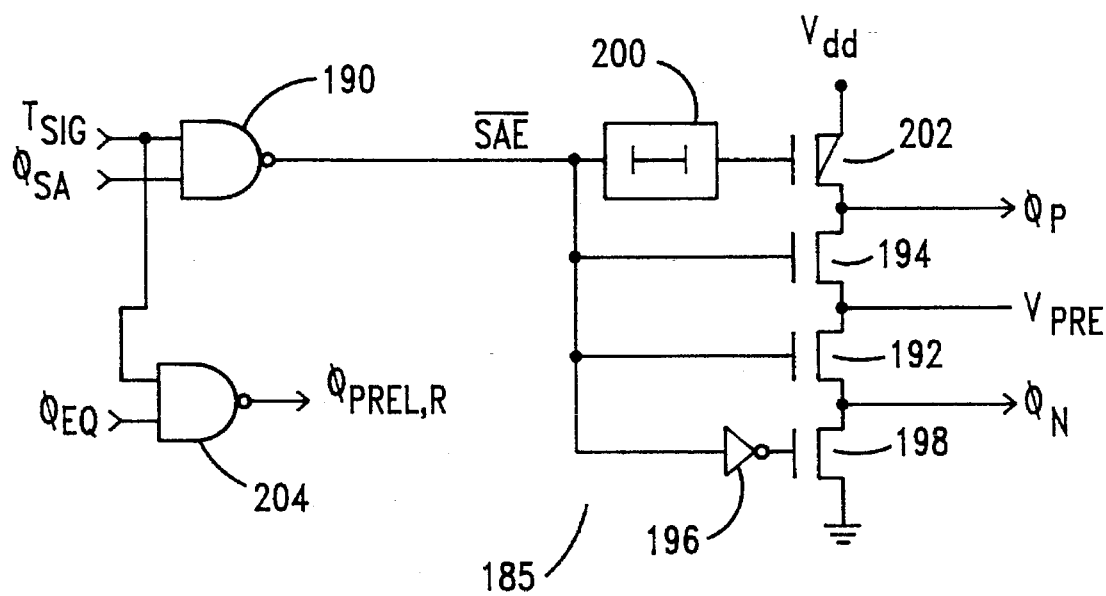
Figure 3C:
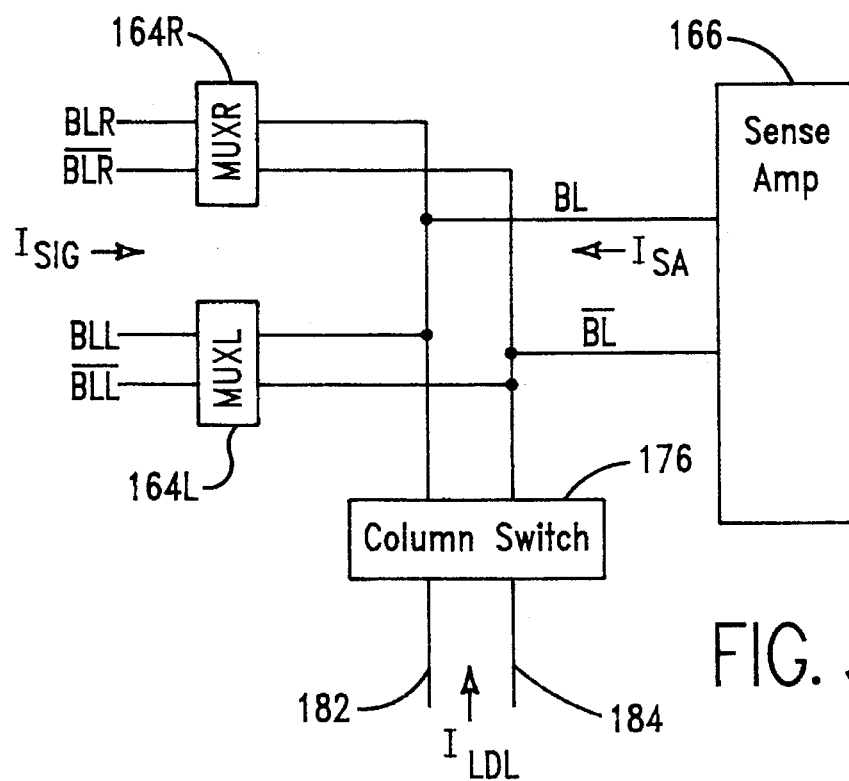

FIG. 3A schematically represents an array cross section of a 256 Mb DRAM with a sense amp shared by two bit line pairs and FIG. 3B is a schematic of control logic therefor according to the present invention. Normally, $V_{PRE}=V_{dd/2}$. It is intended that each sense amp may be connected through high resistance pass gates to a single bit line pair, or to two or more bit line pairs without departing from the spirit of the present invention. FIG. 3C is a block diagram of the preferred embodiment sense amp, column switch and mux of FIG. 3A.

FIG. 3A shows the sense amp 166 shared by two bit line pairs, a right pair and a left pair. For convenience these pairs, and elements in each pair, are labeled identically and distinguished by an L or R. Thus, the cell in the left pair is designated 160L and the cell in the right pair is designated 160R. Each bit line pair includes an equalization circuit 162L, 162R, gated by a restore line 163L, 163R, which operates substantially as described above. Additionally, in this shared sense amp configuration, according to the preferred embodiment of the present invention, each bit line pair is coupled to the sense amp by a pair high-resistance pass gates 164L or 164R, which are half of a multiplexer (mux). Each pair is referred to herein as a mux half 164L, 164R. The mux 164 (164L combined with 164R) is controlled by Mux Select lines MSL and MSR 165L, 165R, respectively, to selectively couple the selected bit line pair to the sense amp 166. The sense amp 166 is a pair of cross coupled NFETs 168, 170 and is enabled by $\Phi_N$ from the control circuit 185 in FIG. 3B. $\Phi_N$ is connected to the sources of sense amp NFETs 168, 170. The sense amp 166 output is connected to the mux 164 at sense amp output pair BL, $\overline{BL}$.

The sense amp is designed to minimize the capacitance on BL, $\overline{BL}$ so that during a read, the bit line pair sees a low RC in the mux direction, as indicated by the arrow labelled $I_{SIG}$ in FIG. 3C. By contrast, the sense amp 166 sees a high RC in the mux direction, as indicated by the arrow labelled $I_{SA}$ in FIG. 3C. Therefore, when the sense amp is coupled to a bit line pair through a mux half 164L, 164R, the signal on the bit line pair is passed to the sense amp, substantially unaffected. However, when the sense amp 166 is set, the mux pass gates act as load resistors for the sense amp and the voltages on the bit line pair remain essentially unaffected.

Once set, data from the sense amp is provided to Local Data Lines (LDLs) 182,184 through column switch 176, which is a pair of low resistance NFET pass gates 178, 180, when $CSL_i$ 186 is high. These column switch pass gates 178, 180 have a substantially lower resistance than the mux half 164L, 164R pass gates. Therefore, when the sense amp is connected to the LDLs through the column switch 176, the primary current through the sense amp is from the LDLs, even though a mux half 164L, 164R remains on and selected. Because the column switch 176 is a pair of NFETs, the potential disturb from coupling the charged (to $V_{dd}$) LDL capacitances to the sense amp is essentially eliminated. The NFET pass gates, because of the NFET threshold voltage, effectively attenuate the noise that is normally introduced in such coupling. Thus, the disturb is eliminated.

LDLs 182, 184 are connected through the MDLs to a traditional sense amp (not shown). This second sense amp exploits the advantages provided by the present invention to improve performance by amplifying the sense amp 166 output as soon as the sense amp 166 forces enough signal on the LDLs 182, 184.

After the data is passed to the LDLs, an active sense amp load, a pair of cross coupled PFETs 172,174, connected to the sense amp 166 output pair BL, $\overline{BL}$, latches the data sensed thereby and provides a full $V_{dd}$ up level. This sense amp load also reinforces data during a normal write. $\Phi_p$, the active sense amp load enable from control circuit 185, is connected to the sources of cross coupled PFETs 172, 174. When $\Phi_p$ rises, the sense amp is latched.

Unlike sense amps in prior art DRAM sensing schemes such as disclosed in U.S. Pat. No. 5,267,214 to Fujishima et al., entitled "Shared-Sense Amp Control signal Generating Circuit in Dynamic Type Semiconductor Memory Device and Operating Method Therefor" which is incorporated herein by reference, these two cross coupled PFETs 172, 174 are not part of the sense amp. Further, Fujishima teaches a RAM wherein the bit lines are connected to the sense amp by low resistance pass gates. Fujishima's pass gates low resistance is further reduced when after enabling and setting the cross-coupled NFET, the drive to the bit line pass gates is boosted above $V_{dd}$ coincident with enabling then crosscoupled PFET portion of the sense amp, such that the sense amp drives full voltage levels back into the bit line pair. Only after setting this PFET portion of Fujishima's sense amp are the column select pass gates opened, thus delaying data from being passed off chip.

By contrast, with the present invention, data has already been passed off chip prior to setting this active load. Furthermore, access time has not been wasted discharging and charging the bit line pair to full voltage levels prior to transferring data off chip. Instead, the bit line pair are driven to full levels subsequent to passing data off chip to a waiting user, but still after enabling the PFET loads 172, 174 to set the sense amp.

The Mux Select line is boosted above $V_{dd}$ to gate full levels to the bit line pair from the sense amp 166 and active sense amp load. When the mux control is boosted above $V_{dd}$, substantially all sense amp current $I_{SA}$ is to/from the bit line pair.

The special control circuit 185 of FIG. 3B provides both normal control and test-specific control for the array, the sense amp and the active sense amp load. Test control signal $T_{SIG}$ input to Control circuit 185 remains high and is driven low during test only. $T_{SIG}$ is NANDed with $\Phi_{SA}$ in NAND gate 190 to generate Sense Amp Enable $\overline{SAE}$. $T_{SIG}$ is also NANDed in one or more NAND gates, represented by single NAND gate 204, with $\Phi_{EQ}$ to generate $\Phi_{PREL}$ and $\Phi_{PRER}$ ($\Phi_{PREL,R}$). Preferably, $\Phi_{EQ}$ is two independent signals $\Phi_{EQL}$ and $\Phi_{EQR}$, which are each NANDed with $T_{SIG}$. Alternatively, an additional L/R select signal may be NANDed with $\Phi_{EQ}$ and $T_{SIG}$ to generate $\Phi_{PREL,R}$. Optionally, $\Phi_{PREL}$ and $\Phi_{PRER}$ may be, simply, identical signals generated from NANDing $\Phi_{EQ}$ and $T_{SIG}$.

The steady state level of $\overline{SAE}$ selects the level of both sense amp enable/disable phase $\Phi_N$ and active sense amp load enable/disable phase $\Phi_p$. $\overline{SAE}$ is connected directly to the gates of NFETs 192, 194, which are connected between $V_{PRE}$ and $\Phi_p$ or $\Phi_N$, respectively. $\overline{SAE}$ is inverted in inverter 196 to generate SAE. SAE, is connected to the gate of NFET 198, which is connected between $\Phi_N$ and ground. Also, $\overline{SAE}$ is connected to input of delay 200, the output of which is connected to the gate of PFET 202. PFET 202 is connected between $V_{dd}$ and $\Phi_p$ to provide a path between $\Phi_P$ and $V_{dd}$ for cross coupled PFETs 172, 174. Delay 200 delays $\overline{SAE}$, preferably until after the sense amplifier is set and the first bit is passed through the column switch 176 to LDLs 182, 184.

The steady state conditions for the signals are as follows: During standby, when $\overline{RAS}$ is high, both $\Phi_{EQ}$ and $\Phi_{SA}$ are low, holding $\Phi_{PREL,R}$ and $\overline{SAE}$ high. So all of the bit lines and both $\Phi_N$ and $\Phi_P$ are clamped at $V_{PRE}$. The sense amp 166 is disabled. However, during an access, $\overline{RAS}$ and $\overline{SAE}$ are low, SAE is high, $\Phi_p$ is high (at $V_{dd}$) and $\Phi_N$ is low (at ground). NFET 198, when it is turned on, provides a path to ground for the sense amplifier 160. PFET 202, when it is turned on, provides a path to $V_{dd}$ for the sense amplifier active load.

In the preferred embodiment of the present invention, delay 200 is a simple polysilicon RC delay and inverters for re-forming the signal therefrom. In another alternate embodiment, delay 200 is an even number of series connected inverters and, more particularly, between 6 and 8 inverters.

Figure 4:
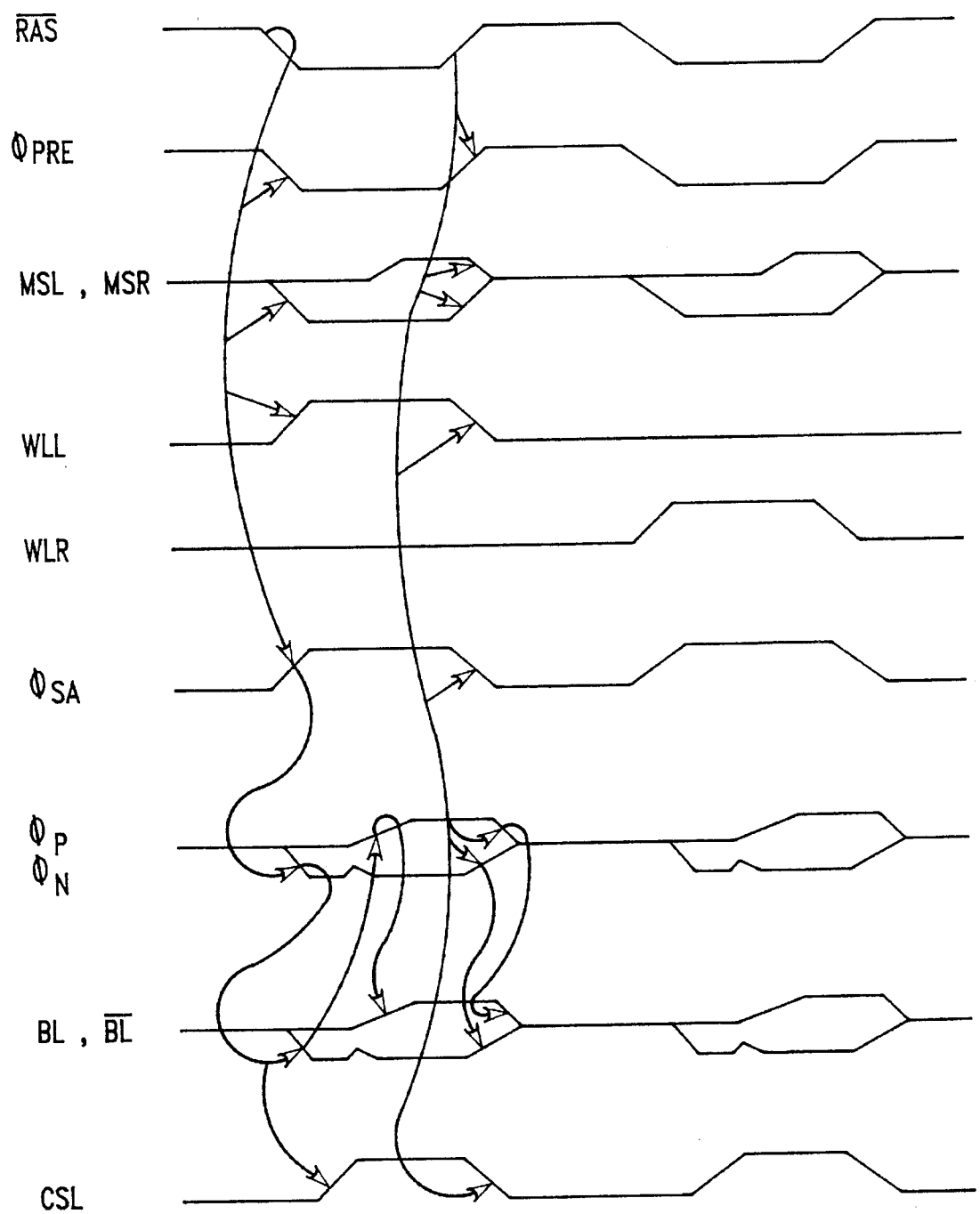
FIG. 4 is a timing diagram for using the preferred embodiment cross section of FIGS. 3A–C.

FIG. 4 is a timing diagram for reading the array of FIG. 3A using the control logic circuit 185 of FIG. 3B according to the preferred embodiment of the present invention. Normally, under normal operating conditions, $T_{SIG}$ is tied high and $V_{PRE}$ is held at $V_{dd}/2$. $\overline{RAS}$, which is a typical DRAM select signal, drives a typical timing chain that selects and drives the word line WL, the bit line equalization signal $\Phi_{EQ}$ and the sense amp enable signal $\Phi_{SA}$. NFETs 192, 194 couple $V_{PRE}$ to $\Phi_N$ and $\Phi_P$, normally, during standby, when $\overline{RAS}$ is high, but also during test, when both $T_{SIG}$ and $\overline{RAS}$ are low. $\Phi_{PREL}$, $\Phi_{PRER}$ are low only when equalization signal $\Phi_{EQ}$ and Test control signal $T_{SIG}$ are both high. Otherwise, when $\overline{RAS}$ is high or, during test when both $T_{SIG}$ and $\overline{RAS}$ are low, the pair of lines in each bit line pair are tied together and to $V_{PRE}$. $V_{PRE}$ is uncoupled from the bit lines and sense amp during sense. Preferably, $\Phi_P$, $\Phi_N$, and $\Phi_{PREL,R}$ are common lines provided to multiple bit lines. Alternatively, the control of $\Phi_P$, $\Phi_N$, and $\Phi_{PREL,R}$ may be generated individually for each bit line pair.

So, in FIG. 4, a READ access begins with when $\overline{RAS}$ falls. $\overline{RAS}$ falling drives $\Phi_{EQL,R}$ high, which causes $\Phi_{PRE}$ to fall to shut off equalization devices 210, 212 and isolates the bit line pairs from $V_{PRE}$ when NFETs 214, 216, 218, and 220 are shut off. A word line WLL rises, connecting a cell 160L to the bit line pair BLL, $\overline{BLL}$. As the word line rises the mux control line 165R on the unselected bit line pair falls, isolating that pair from the sense amp. The mux control line 165L on the selected bit line pair remains high, passing any signal from the selected bit line pair to the sense amp. $V_{SIG}$ is generated on BLL, $\overline{BLL}$ as $V_S$ is transferred from the cell. $V_{SIG}$ is passed to the sense amp on BL, $\overline{BL}$ because the sense amp capacitance is small. So, once $V_{SIG}$ develops on the bit line pair BLL, $\overline{BLL}$, $\Phi_{SA}$ rises driving $\overline{SAE}$ low. $\overline{SAE}$ low turns off NFETs 192, 194, isolating $\Phi_P$ and $\Phi_N$ from $V_{PRE}$. $\overline{SAE}$ is inverted in inverter 196, driving SAE high. SAE high turns on NFET 198 to pull $\Phi_N$ to ground, which sets the sense amp 166. Depending on $V_{SIG}$, the sense amp pulls one of the sense amp outputs BL, $\overline{BL}$ low.

When the sense amp 166 is set, the selected half mux 164L acts as very high resistance load resistors for the sense amp 166. So, even though one side of the sense amp is pulled to ground, the selected half mux 164L limits the current that the sense amp pulls from the bit line pair so that the bit lines remain essentially at their sense condition, $V_{dd}/2$ and $V_{SIG}$. It is understood, that after sufficient time in this state, the sense amp would discharge one of the bit line pair to ground through the mux 164.

After the sense amp is set, $CSL_i$ is driven high to open the column switch 176 connecting the local data lines 182, 184 (which are pre-charged to $V_{dd}$) to sense amp outputs BL, $\overline{BL}$, respectively. By contrast to the selected half mux 164L, the column switch pass gates 178, 180 have a much higher width to length ratio (W/L) and, therefore, exhibit much lower resistance. The column switch pass gates 178, 180 are designed such that, when the column switch 176 is selected, most of the current flowing into the sense amp is from the LDLs with the selected half mux 164L providing very little current from the bit line pair. Further, the NFET pass gates 178 and 180 limit the voltage passed from the LDLs to the sense amp 166 avoiding destruction of the sensed data therein.

Thus, almost simultaneously, data is sensed, passed to the LDLs 182, 184 and, then, passed to the MDLs for re-sensing in a second sense amp (not shown). All of this occurs prior to setting the cross coupled PFETs 172, 174. This significantly reduces latency over prior art DRAMs, an important advantage for SDRAMs or EDO burst DRAMs.

Subsequently, $\overline{SAE}$ passes through the delay 200 to pull the gate of PFET 202 low, which drives $\Phi_P$ to $V_{dd}$. With $\Phi_P$ at $V_{dd}$, the active sense amp load cross-coupled PFETs 172, 174 pull the floating side of the sense amp high, to $V_{dd}$, latching the sense amp 166. After the active sense load is enabled, the mux select 165L or 165R is boosted above $V_{dd}$ to diminish the selected mux's select resistance such that data is quickly forced onto the Bit line pair BL, $\overline{BL}$ and written back into the cell.

When $\overline{RAS}$ rises, the READ ends and the RAM is forced into standby. Thus, $\overline{RAS}$ rising resets the word line WLL, pulling it low. After the word line falls, $\Phi_{SA}$ is pulled low. $\Phi_{SA}$ is inverted by NAND gate 190 driving $\overline{SAE}$ high driving the gates of NFETs 192, 194 to return $\Phi_P$ and $\Phi_N$ to $V_{PRE}$. Once the sense amp is disabled, the equalization signal $\Phi_{EQ}$ is pulled low and NAND gate 204 drives $\Phi_{PREL,R}$ high. Thus, with $\Phi_{PREL,R}$ high, equalization NFETs 210, 212 are on to effectively short the bit line pair together. $V_{PRE}$ (at $V_{dd}/2$) passes through NFETs 214, 216, 218, and 220 to the bit line pairs. Once the bit lines are equalized and pre-charged to $V_{dd}/2$, the next RAS cycle may begin.

While the present invention is described in terms of preferred embodiments, it is understood that numerous variations and modifications will occur to a person skilled in the art without departing in spirit from the claimed invention. It is intended that the scope of the claims include those modifications and variations that fall within the spirit of the invention.

We claim:

1. A Dynamic Random Access Memory (DRAM) comprising:

an array of memory cells organized in rows and columns;

a word line in each said row, said word line being connected to memory cells in said row, said word line being responsive to a row address;

a bit line pair in each said column, said column being selected responsive to a column address, said bit line pair including:

restoring means for restoring said bit line pair to a reference voltage level, equalization means for selectively shorting both lines of said bit line pair together, and, bit selection means for selecting said bit line pair;

sensing means for sensing data stored in said memory cells responsive to an enable signal, said sensing means connected to a selected bit line pair through said bit selection means;

column selection means for selectively coupling said sensing means and a selected bit line pair to a Local Data Line (LDL); and, said bit selecting means having a higher resistance than said column selection means during a READ.

2. The DRAM of claim 1 wherein each said column includes a plurality of bit line pairs, said bit selection means of said plurality of bit line pairs being coupled together to form a mux.

3. The DRAM of claim 1 wherein the bit selection means is a pair of NFETs.

4. The DRAM of claim 3 wherein the column selection means is a pair of NFETs.

5. The DRAM of claim 1 wherein said sensing means is a sense amp and, the bit selection resistance is such that a data signal on said selected bit line pair is passed to said sense amp and setting said sense amp leaves signal on said bit line pair substantially unaffected.

6. The DRAM of claim 1 wherein said sensing means is a sense amp and, the column selection resistance is such that when said sense amp is set, data in said sense amp is passed to said LDL and signal on said bit line pair substantially unaffected.

7. The DRAM of claim 1 wherein the select resistance of said bit selection means is substantially less during a write than during a read.

8. The DRAM of claim 1 wherein the sensing means is a sense amp and further comprising means for latching sensed data in said sense amp.

9. The DRAM of claim 8 wherein the sense amp is a pair of cross coupled NFETs and the latching means is a pair of cross coupled PFETs.

10. The DRAM of claim 9 wherein each said column includes a plurality of bit line pairs, said bit selection means of said plurality of bit line pairs being coupled together to form a mux.

11. The DRAM of claim 9 wherein the bit selection means is a pair of NFETs.

12. The DRAM of claim 11 wherein the column selection means is a pair of NFETs.

13. The DRAM of claim 9 wherein the bit selection resistance is such that a data signal on said selected bit line pair is passed to said sense amp and setting said sense amp leaves signal on said bit line pair substantially unaffected.

14. The DRAM of claim 13 wherein the column selection resistance is such that when said sense amp is set, data in said sense amp is passed to said LDL and signal on said bit line pair substantially unaffected.

15. A Dynamic Random Access Memory (DRAM) comprising:
    an array of memory cells organized in rows and columns;
    a word line in each said row, said word line being connected to memory cells in said row, said word line being responsive to a row address;
    a plurality of bit line pairs in each said column, said column being selected responsive to a column address, each said bit line pair including:
    restoring means for restoring said bit line pair to a reference voltage level,
    equalization means for selectively shorting both lines of said bit line pair together, and,
    a partial mux, said partial mux being a pair of NFETs, each said bit line of said pair being connected to one said NFET;
    a sense amp connected to said column's plurality of bit line pairs through each said bit line pair's partial mux;
    means for latching sensed data in said sense amp;
    column select pass gates connected between said sense amp and a Local Data Line (LDL); and,
    said partial mux having a higher select resistance than said column select pass gates during a READ and having a substantially lower select resistance during a WRITE.

16. The DRAM of claim 15 wherein the select resistance of the NFETs in the partial muxes is such that a data signal on a selected bit line pair is passed to said sense amp and, setting said sense amp leaves signal on said bit line pair substantially unaffected.

17. The DRAM of claim 15 wherein the column select pass gates' select resistance is such that when said sense amp is set, data in said sense amp is passed to said LDL and signal on said bit line pair substantially unaffected.

18. The DRAM of claim 15 wherein the sense amp is a pair of cross coupled NFETs and the latching means is a pair of cross coupled PFETs.

19. A Dynamic Random Access Memory (DRAM) comprising:
    an array of memory cells organized in rows and columns;
    a word line in each said row, said word line being connected to memory cells in said row, said word line being responsive to a row address;
    a plurality of bit line pairs in each said column, said column being selected responsive to a column address, each said bit line pair including:
    restoring means for restoring said bit line pair to a reference voltage level,
    equalization means for selectively shorting both lines of said bit line pair together, and,
    a partial mux, said partial mux being a pair of NFETs, each said bit line of said pair being connected to one said NFET;
    a sense amp, said sense amp being connected between a sense enable and a mux, said mux being said column's plurality of bit line pair's partial muxes, the select resistance of the NFETs in the partial muxes is such that a data signal on a selected bit line pair is passed to
    said sense amp and, setting said sense amp leaves signal on said bit line pair substantially unaffected;
    a pair of cross coupled PFETs connected between said sense amp and a sense latch enable, the column select pass gates' select resistance is such that when said sense amp is set, data in said sense amp is passed to said LDL and signal on said bit line pair substantially unaffected;
    column select pass gates connected between said sense amp and a Local Data Line (LDL); and,
    said partial mux having a higher select resistance than said column select pass gates during a READ and having a substantially lower select resistance during a WRITE.

* * * * *